United States Patent [19]
Midya et al.

[11] Patent Number: 6,141,541
[45] Date of Patent: Oct. 31, 2000

[54] METHOD, DEVICE, PHONE AND BASE STATION FOR PROVIDING ENVELOPE-FOLLOWING FOR VARIABLE ENVELOPE RADIO FREQUENCY SIGNALS

[75] Inventors: Pallab Midya, Schaumburg; Lawrence E. Connell, Naperville; Steven F. Gillig, Roselle; John Grosspietsch, Libertyville; Andrew Merritt Khan, Schaumburg; George Francis Opas, Park Ridge, all of Ill.; Robert Louis Palandech, Sunrise, Fla.

[73] Assignee: Motorola, Inc., Schaumburg, Ill.

[21] Appl. No.: 09/001,762

[22] Filed: Dec. 31, 1997

[51] Int. Cl.[7] ................................................. H04B 1/02
[52] U.S. Cl. ........................... 455/91; 455/127; 455/108
[58] Field of Search ............................... 455/126, 127, 455/91, 115, 108; 330/129, 149

[56] References Cited

U.S. PATENT DOCUMENTS

| | | | |
|---|---|---|---|
| 4,811,423 | 3/1989 | Eastmond | 455/203 |
| 5,105,164 | 4/1992 | Fisher et al. | 330/149 |
| 5,132,634 | 7/1992 | Suarez | 330/129 |
| 5,251,330 | 10/1993 | Chiba et al. | 455/91 |
| 5,420,536 | 5/1995 | Faulkner et al. | 330/149 |
| 5,467,055 | 11/1995 | Wray et al. | 330/129 |
| 5,486,789 | 1/1996 | Palandech et al. | 330/149 |
| 5,553,318 | 9/1996 | Ohmagari et al. | 455/126 |
| 5,559,468 | 9/1996 | Gailus et al. | |
| 5,564,086 | 10/1996 | Cygan et al. | |
| 5,841,319 | 11/1998 | Sato | 330/129 |
| 5,901,346 | 5/1999 | Stengel et al. | 455/126 |
| 5,905,407 | 5/1999 | Midya | 330/10 |

OTHER PUBLICATIONS

Leonard R. Kahn, "Single–Sideband Transmission by Envelope Elimination and Restoration", Proceedings of the I.R.E. Jul. 1952, pp. 803–806.

Fred Raab and Daniel J. Rupp "Class–S High–Efficiency Amplitude Modulator" GMRR TP93–1: RF Design vol. 17. No. 5 pp. 70–74, May 1994.

F. H. Rabb and D. J. Rupp, "High–Efficiency Single–Sideband HF/VHF Transmitter based upon Envelope Elimination and Restoration", Green Mountain Radio Research Company, USA, pp. 21–25.

PhD Thesis of Pallab Midya, 1995 at University of Illinois at Champaign–Urbana, IL (not enclosed—to be sent upon receipt of a copy).

*Primary Examiner*—Dwayne D. Bost
*Assistant Examiner*—Joy Redmon

[57] ABSTRACT

A method (200) and device (100) provide an efficient linear power amplifier that generates a variable-envelope radio frequency RF signal. The method includes the steps of: A) using an efficient envelope-following unit to output a supply voltage in accordance with a variable envelope of an input baseband signal, wherein using the efficient envelope-following unit includes: 1) using a bandwidth-limiting mapping unit to determine a reference signal based on the baseband signal; and 2) using an envelope-tracking power converter to output a supply voltage, responsive to the reference signal, to the linear RF power amplifier; B) providing an RF input signal with amplitude and phase information to a linear RF power amplifier; and C) using the linear RF power amplifier to output a power-efficient amplified variable-envelope RF signal with substantially a same amplitude and phase information as the RF input signal.

23 Claims, 12 Drawing Sheets

METHOD, DEVICE, PHONE AND BASE STATION FOR PROVIDING ENVELOPE-FOLLOWING FOR VARIABLE ENVELOPE RADIO FREQUENCY SIGNALS

RELATED INVENTION

The present invention is related to another invention, CR00151 M, METHOD, DEVICE, PHONE, AND BASE STATION FOR PROVIDING AN EFFICIENT TRACKING POWER CONVERTER FOR VARIABLE SIGNALS, by Pallab Midya, Lawrence Connell, John Grosspietsch and Ronald Gene Meyers, which is being filed concurrently and is also assigned to Motorola, Inc.

FIELD OF THE INVENTION

The present invention relates to power amplifiers and more particularly to power amplifiers for variable envelope radio frequency signals.

BACKGROUND OF THE INVENTION

Switched power converters are widely used to convert between DC (direct current) source and load as well as to interface to slowly moving AC (alternating current) inputs and outputs. These uses represent one mode of operation of switched power converters. For the purpose of improving efficiency of RF (radio frequency) power amplifiers, a variable supply is used to power the amplifier. The switched power converter providing the variable supply must have a high efficiency, very low switching noise, high bandwidth and slew rate. This represents a different mode of operation for a switched power converter. Using conventional control schemes which have been developed for essentially DC sources and loads, these objectives can be met only by switching at a rate much higher than the envelope bandwidth, resulting in lower efficiency and EMI (electromagnetic interference) problems. A new method and device are needed specifically for providing an efficient linear power amplifier that generates a variable envelope radio frequency RF signal that alleviates such problems.

DETAILED DESCRIPTION OF A PREFERRED EMBODIMENT

Figure 1:
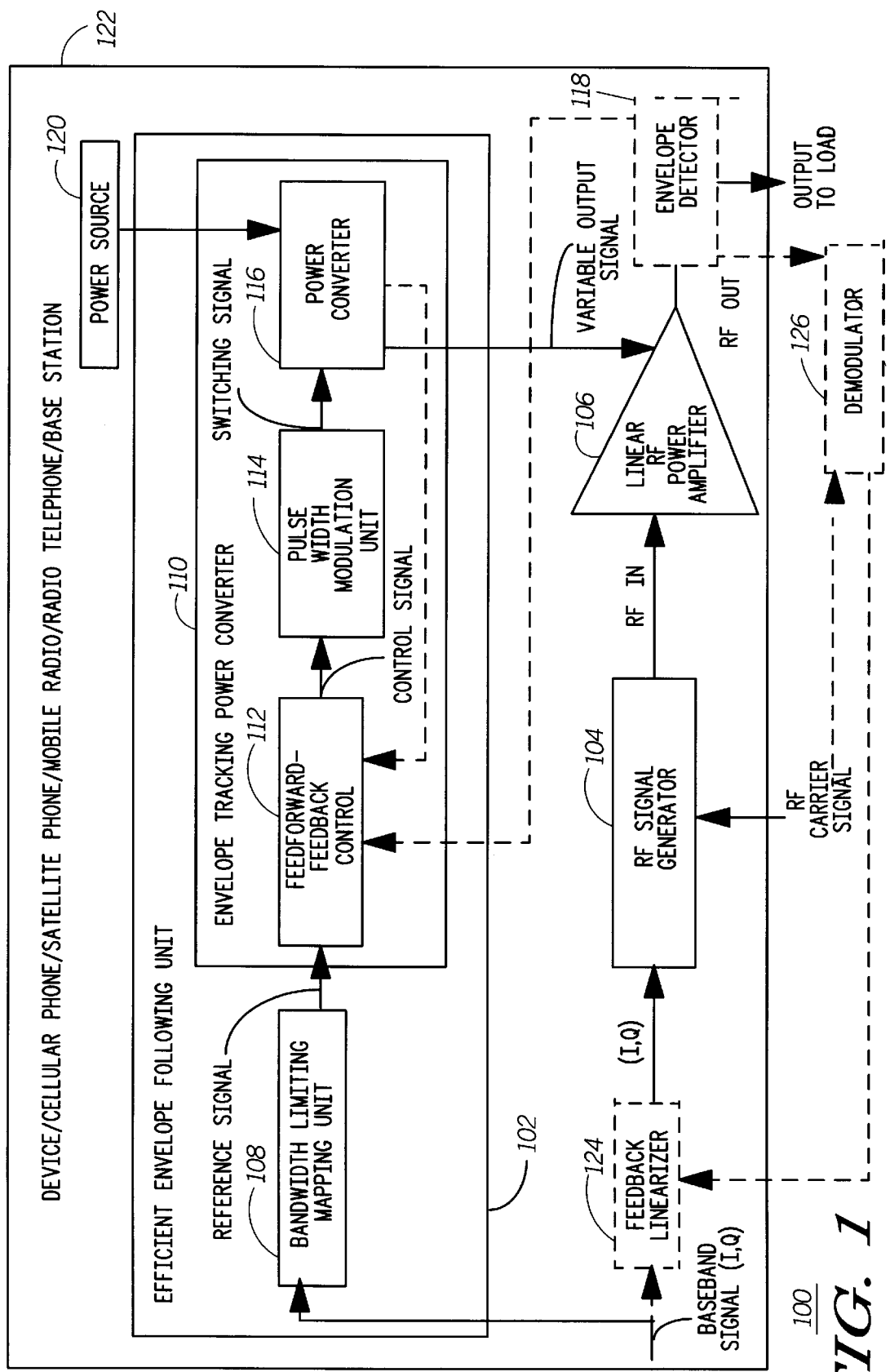
FIG. 1 is a block diagram of one embodiment of a device/phone/mobile/radio telephone/base station for using a variable envelope RF signal in accordance with the present invention to provide an efficient linear power amplifier.

FIG. 1, numeral 100, is a block diagram of one embodiment of a device/phone/mobile/radio telephone/base station for using a variable envelope RF signal in accordance with the present invention to provide an efficient linear RF power amplifier (106). An efficient envelope-following unit (102) is coupled to receive a baseband signal and outputs a supply voltage in accordance with a variable envelope of the baseband signal. The efficient envelope-following unit (102) includes: 1) a bandwidth-limiting mapping unit (108), coupled to receive the baseband signal, for determining a reference signal; and 2) an envelope-tracking power converter (110), coupled to receive the reference signal and to a power source, for outputting a supply voltage to the linear RF power amplifier (106) responsive to the reference signal. An RF signal generator (104) is coupled to receive the baseband signal and an RF carrier signal and provides an RF input signal with amplitude and phase information to the linear RF power amplifier (106). The linear RF power amplifier (106) is coupled to the efficient envelope-following unit (102) and to the RF signal generator (104) and outputs a power efficient amplified variable envelope RF signal with substantially a same amplitude and phase information as the RF input signal.

The bandwidth-limiting mapping unit (108) typically utilizes a polynomial mapping function of the baseband signal to provide an implicitly bandlimited signal. Coefficients of the polynomial mapping function are generally selected to at least: maintain a substantially constant gain for the linear RF power amplifier (106), to reduce the phase shift imposed by the linear RF power amplifier (106), to limit a minimum value of the supply voltage for the linear RF power amplifier (106), or to maximize efficiency of the linear RF power amplifier (106).

The bandwidth-limiting mapping unit (108) may use a polynomial mapping function of a square of the variable envelope of the baseband signal to provide an implicitly bandlimited signal.

Alternatively, the bandwidth-limiting mapping unit (108) may utilize a transcendental function of the variable envelope of the baseband signal to provide a bandlimited signal—the function characterized by even mathematical symmetry.

In one embodiment, a demodulator (126) may be coupled to the RF output and to the RF carrier signal, for demodulating the amplified variable envelope RF signal, and a feedback linearizer (124) may be coupled to the demodulator (126) and to the baseband signal for linearizing the RF power amplifier (106).

The envelope tracking power converter (110) typically includes a feedforward feedback control unit (112), a pulse width modulation unit (114), and a power converter (116). The feedforward feedback control unit (112) is coupled to the bandwidth-limiting mapping unit (108) and, where selected, to receive at least one feedback signal. The feedforward feedback control unit (112) determines an optimal control signal. The pulse width modulation unit (114) is coupled to the feedforward feedback control unit (112) and is used for modifying a pulse width to provide a constant frequency switching signal. The power converter (116) is coupled to the pulse width modulation unit (114) and to the power source (120) and provides a variable output signal to the linear RF power amplifier (106).

Generally, the linear RF power amplifier (106) is a class AB amplifier or a class B amplifier.

Where selected, at least one feedback signal is sent to the feedforward feedback control unit (112). The power converter (116) may provide a feedback signal and/or an envelope detector (118) coupled to the linear RF power amplifier (106) output may provide a feedback signal to the feedforward feedback control unit (112). The bandwidth-limiting mapping unit (108) may use a polynomial mapping function of $I^2$ plus $Q^2$, which is a square of the envelope of the baseband signal to provide an implicitly bandlimited signal.

The device (122) is typically implemented in a cellular phone, a satellite phone, a mobile radio, a radio telephone, a base station or the like.

Figure 2:
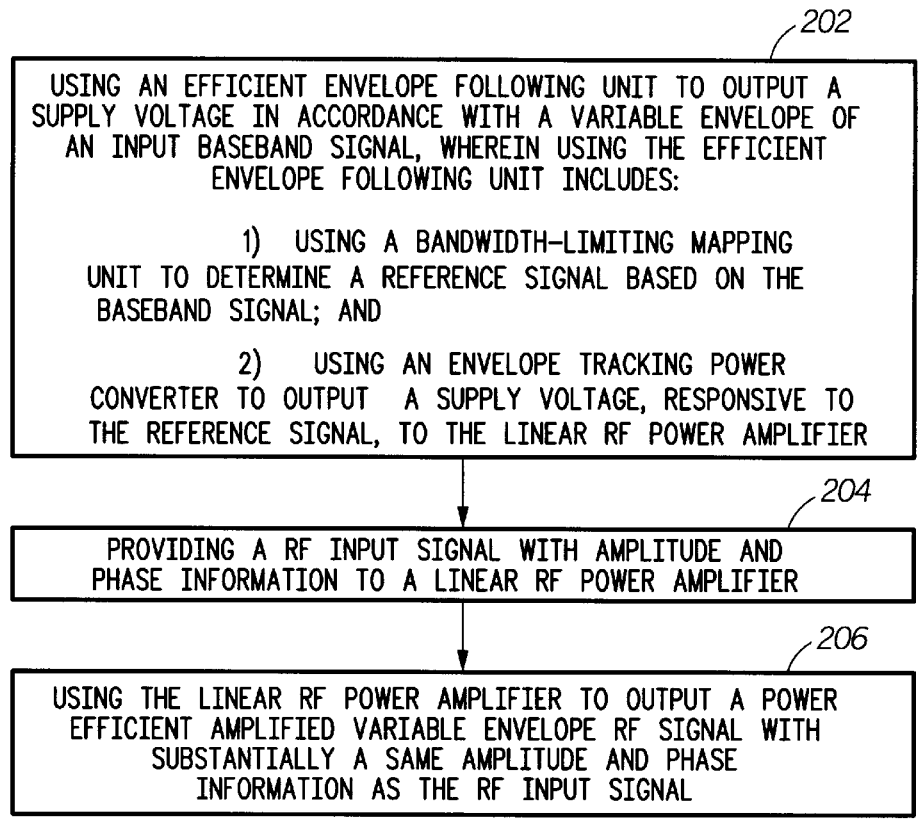
FIG. 2 is a flow chart of one embodiment of steps of a method for using a variable envelope RF signal in accordance with the present invention to provide an efficient linear power amplifier.

FIG. 2, numeral 200, is a flow chart of one embodiment of steps of a method for using a variable envelope RF signal in accordance with the present invention to provide an efficient linear power amplifier. The method includes the steps of: A) using (202) an efficient envelope-following unit to output a supply voltage in accordance with a variable envelope of an input baseband signal, wherein using the efficient envelope-following unit includes: 1) using a bandwidth-limiting mapping unit to determine a reference signal based on the baseband signal; and 2) using an envelope tracking power converter to output a supply voltage, responsive to the reference signal, to the linear RF power amplifier; B) providing (204) a RF input signal with amplitude and phase information to a linear RF power amplifier; and C) using (206) the linear RF power amplifier to output a power efficient amplified variable envelope RF signal with substantially a same amplitude and phase information as the RF input signal.

Where selected, using a linear RF power amplifier further may include providing (208) an envelope detector coupled to the linear RF power amplifier output to provide a feedback signal to the envelope tracking power converter.

Again, the linear RF power amplifier is typically a class AB amplifier or a class B amplifier.

Figure 3:
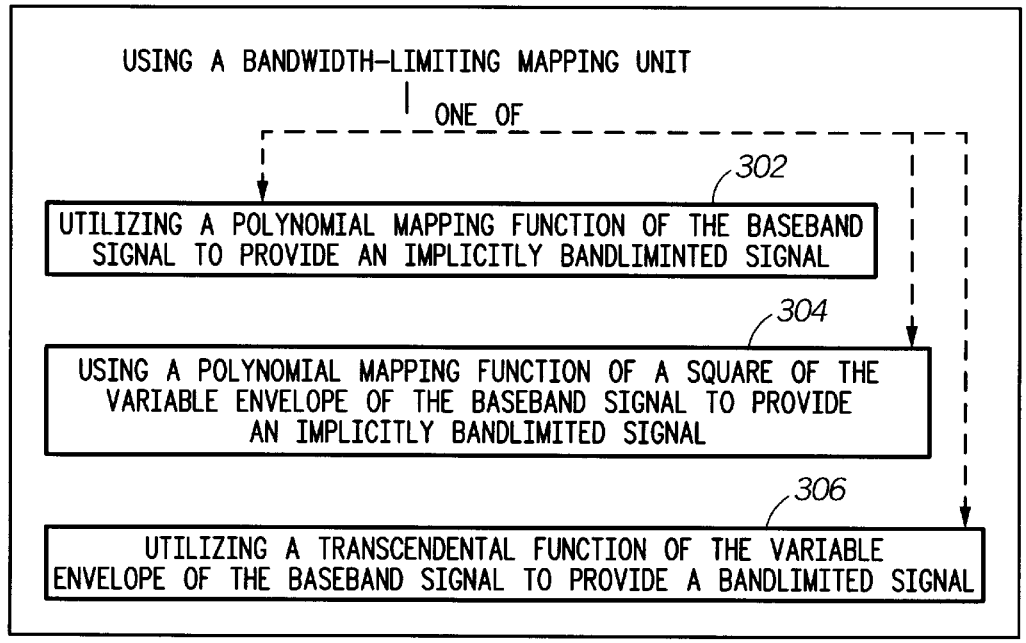
FIG. 3 is a flow chart showing, with greater particularity, the step from FIG. 2 of using a bandwidth-limiting mapping unit in accordance with the present invention.

As shown in FIG. 3, numeral 300, the step from FIG. 2 of using a bandwidth-limiting mapping unit in accordance with the present invention may include one of: utilizing (302) a polynomial mapping function of the baseband signal to provide an implicitly bandlimited signal, using (304) a polynomial mapping function of a square of the variable envelope of the baseband signal to provide an implicitly bandlimited signal or utilizing (306) a mathematically even transcendental function of the variable envelope of the baseband signal to provide a bandlimited signal.

Figure 4:
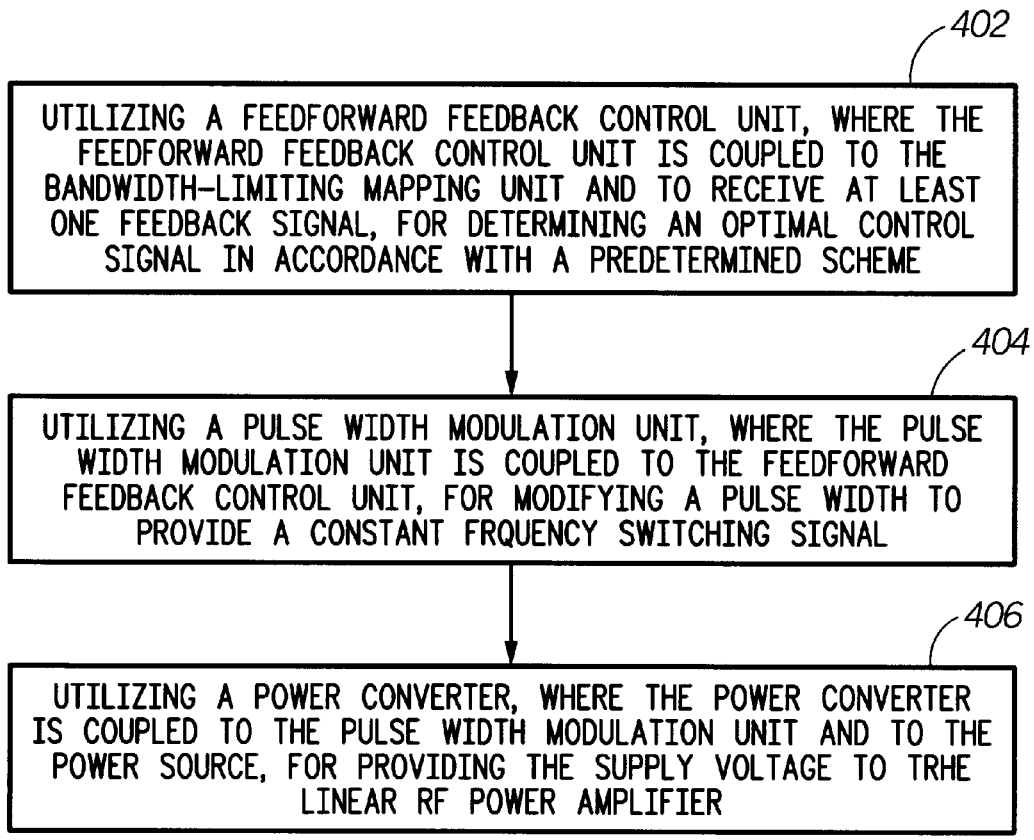
FIG. 4 is a flow chart showing, with greater particularity, the step from FIG. 2 of using an envelope tracking power converter in accordance with the present invention.

As shown in FIG. 4, numeral 400, the step from FIG. 2 of using an envelope tracking power converter in accordance with the present invention typically includes: A) utilizing (402) a feedforward feedback control unit, where the feedforward feedback control unit is coupled to the bandwidth-limiting mapping unit and, where selected, to receive at least one feedback signal, for determining an optimal control signal in accordance with a predetermined scheme; B) utilizing (404) a pulse width modulation unit, where the pulse width modulation unit is coupled to the feedforward feedback control unit, for modifying a pulse width to provide a constant frequency switching signal; and C) utilizing (406) a power converter, where the power converter is coupled to the pulse width modulation unit and to the power source, for providing the supply voltage to the linear RF power amplifier. Generally, the linear RF power amplifier is a class AB amplifier or a class B amplifier.

A feedback signal may be provided to the feedforward feedback control unit by the power converter, or alternatively, an envelope detector coupled to the linear RF power amplifier output may provide a feedback signal to the feedforward feedback control unit. In another embodiment both feedback signals may be utilized.

In a preferred embodiment, the step of utilizing the bandwidth-limiting mapping unit generally includes using a polynomial mapping function of $I^2$ plus $Q^2$, which is a square of an envelope of the baseband signal to provide an implicitly bandlimited signal.

Envelope-following is characterized by a variable supply to the RF power amplifier, and an RF input signal that is unmodified and has phase as well as amplitude information. Since the supply does not directly determine the output amplitude, the supply voltage can be chosen to optimize power efficiency and/or RF distortion performance.

To achieve improved spectral performance while maintaining efficiency, a mapping function or transformation is implemented. The function is derived by considering the complex composite input signal in Cartesian format:

$$V_i(t) = I(t) \times \cos \omega_c t + jQ(t) \times \sin \omega_c t \qquad (1)$$

where I(t) and Q(t) are bandlimited baseband quadrature signals. The envelope of $V_i(t)$ is given by:

$$v_e(t) = Envelope(t) = \sqrt{I^2(t) + Q^2(t)} = x \qquad (2)$$

Since I(t) and Q(t) are bandlimited, $I^2(t)$ and $Q^2(t)$ are also bandlimited. But, due to the square root operation associated with envelope generation, the function $v_e(t)$ has an extremely wide spectrum in general. Even-ordered polynomial functions of the variable $v_e(t)$—which generate bandlimited powers of $(I^2(t)+Q^2(t))$—may be applied to the envelope function to reduce the spectral expansion effects of the square root operation. Odd-order terms of order greater than one also provide improvement over the pure envelope signal, but not to the extent that the even-order terms do, and consequently produce a wider spectrum than even-order terms. In addition to the spectrum occupancy issues, the calculation of the square root function is computationally intensive. Therefore, alternate methods to create the envelope signal are required.

Figure 5:
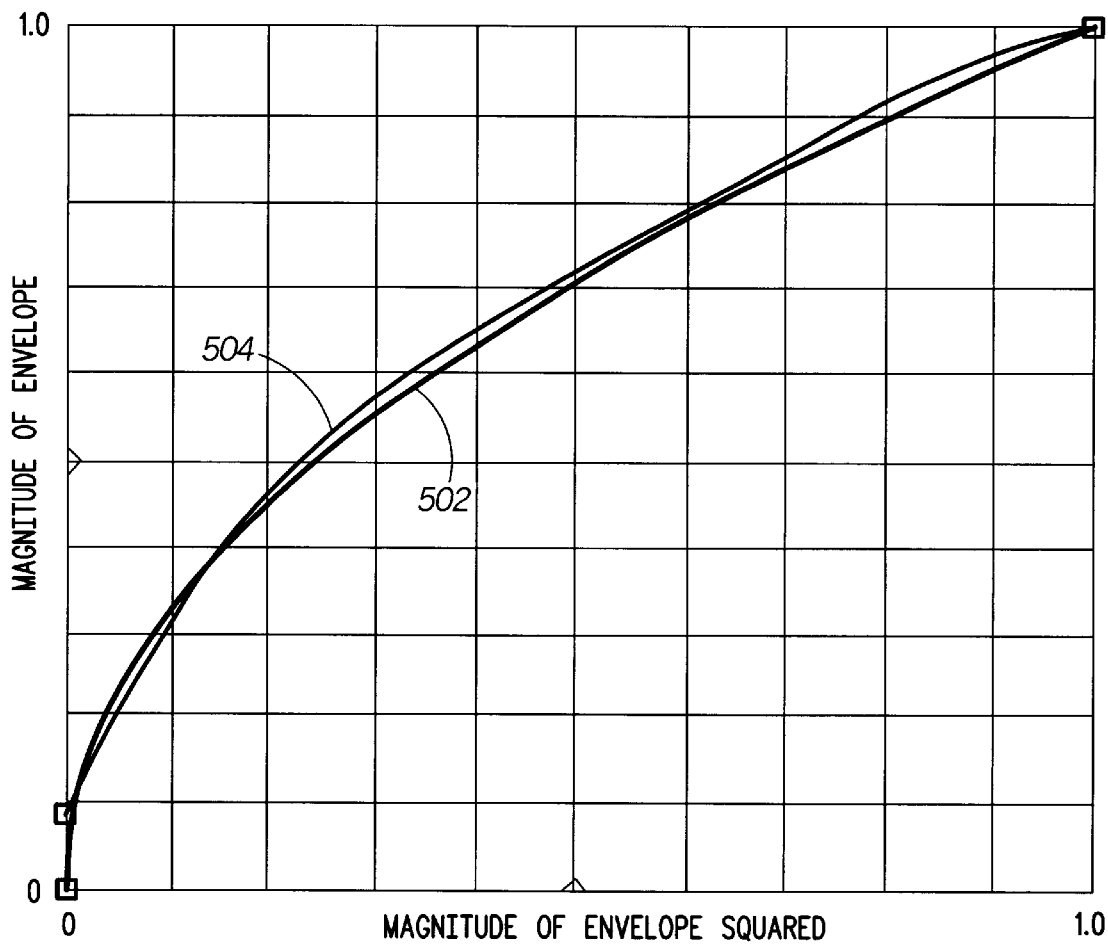
FIG. 5 is a graphical representation comparing the approximate square root used for the envelope supply mapping to the ideal square root function.

In FIG. 5, numeral 500, the approximate square root (504) used for the envelope supply mapping is compared to the ideal square root function (502). The following section shows an analysis of a polynomial mapping function that maps the ideal square root function to the approximate square root Define the supply to the RF PA to be y. Computing a square root is a computationally intensive operation. Thus, the supply may be computed as a function of the envelope squared.

$$\text{Supply}=y=f(x^2) \tag{3}$$

Consider a fourth order polynomial mapping function of the envelope squared. Since the baseband (I,Q) signals are band limited to $F_{channel}$ the supply bandwidth in this case would be limited to 8 ($F_{channel}$).

$$y=a_0+a_2x^2+a_4x^4+a_6x^6+a_8x^8 \tag{4}$$

The error in the supply compared to the ideal square-root is as follows: The average error squared is defined to be the cost function J. The weighting function is chosen to be the power of the error signal since the out of band power is to be minimized.

$$J=\int(\text{error})^2 dt \tag{5}$$

This cost function is minimized by choosing the appropriate polynomial coefficients.

$$\frac{dJ}{da_0}=\frac{dJ}{da_2}=\frac{dJ}{da_4}=\frac{dJ}{da_6}=\frac{dJ}{da_8}=0 \tag{6}$$

Though the base band signals (I,Q) are time varying, the associated statistics are not time varying. In other words the condition of ergodicity is imposed on this analysis. Under this condition, a large sample of the data may be used to predict all statistical information about the process. A large section of the data is typically used to optimize the polynomial coefficients.

$$J=\int_0^T (a_0+a_2x^2+a_4x^4+a_6x^6+a_8x^8-x)^2 dt \tag{7}$$

Differentiating under the integral sign, the following equations are obtained:

$$\frac{dJ}{da_0}=\int_0^T [2(a_0+a_2x^2+a_4x^4+a_6x^6+a_8x^8-x)]dt=0 \tag{8}$$

$$\frac{dJ}{da_2}=\int_0^T [2(a_0+a_2x^2+a_4x^4+a_6x^6+a_8x^8-x)]dt=0 \tag{9}$$

The higher order terms that follow may be computed similarly. The baseband data (I,Q) is usually available in sampled format. Thus, the integrals are reduced to summation. Using a large number of discrete data points, the values for the polynomial coefficients are obtained by solving a set of simultaneous equations. Though this analysis is being done here for a fourth order polynomial of the envelope squared, the method extends to a polynomial of arbitrary order. The results may be combined as follows.

$$[C]\times\begin{bmatrix}a_0\\a_2\\a_4\\a_6\\a_8\end{bmatrix}=[D] \tag{10}$$

The values for the elements of the matrix C are as follows.

$$C(i,j)=\Sigma x^{2(i+j-2)} \tag{11}$$

The values of the elements of the vector D are as follows.

$$D(i,j)=\Sigma x^{(2i-1)} \tag{12}$$

After the polynomial coefficients are computed, the supply voltage is computed in terms of the envelope squared. The number of addition and multiplication operations may further be reduced by factoring the polynomial. However, it is possible for some of the polynomial coefficients to be complex.

The example case here is a 25 ksps QPSK system where the baseband data is sampled at 400 ksps. The amplitudes are normalized from zero to unity. In this case, the roots of the polynomial are 1.5035, 0.4931+0.7802i, 0.4931−0.7802i and −0.0272. The computation of the envelope to supply mapping is as follows.

$$y=(x^2+r_1)(x^2+r_2)(k_2x^4+k_1x^2+k_0) \tag{13}$$

Figure 6:
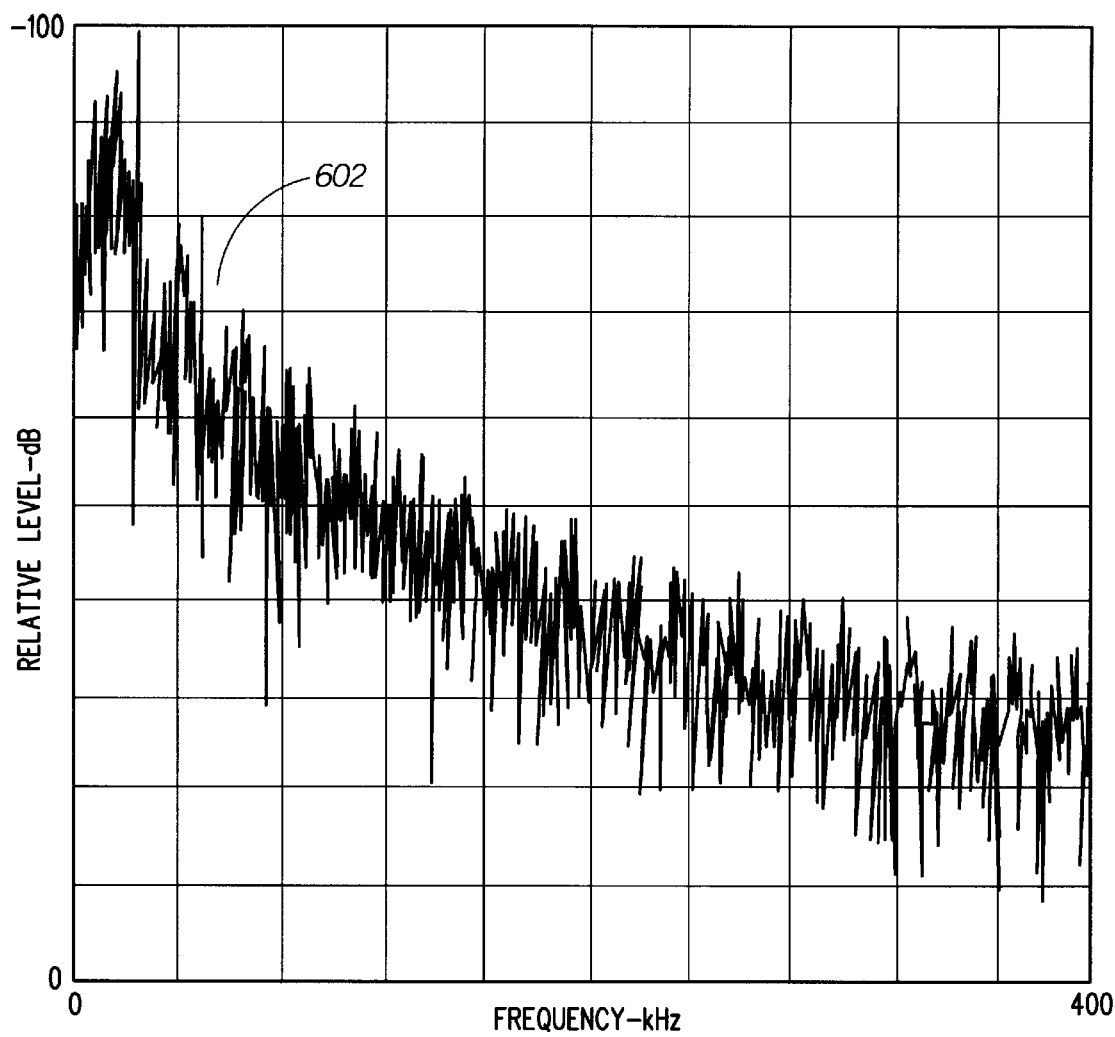
FIG. 6 is a graphical representation showing the ideal envelope spectrum for a 25 kHz QPSK signal.
Figure 7:
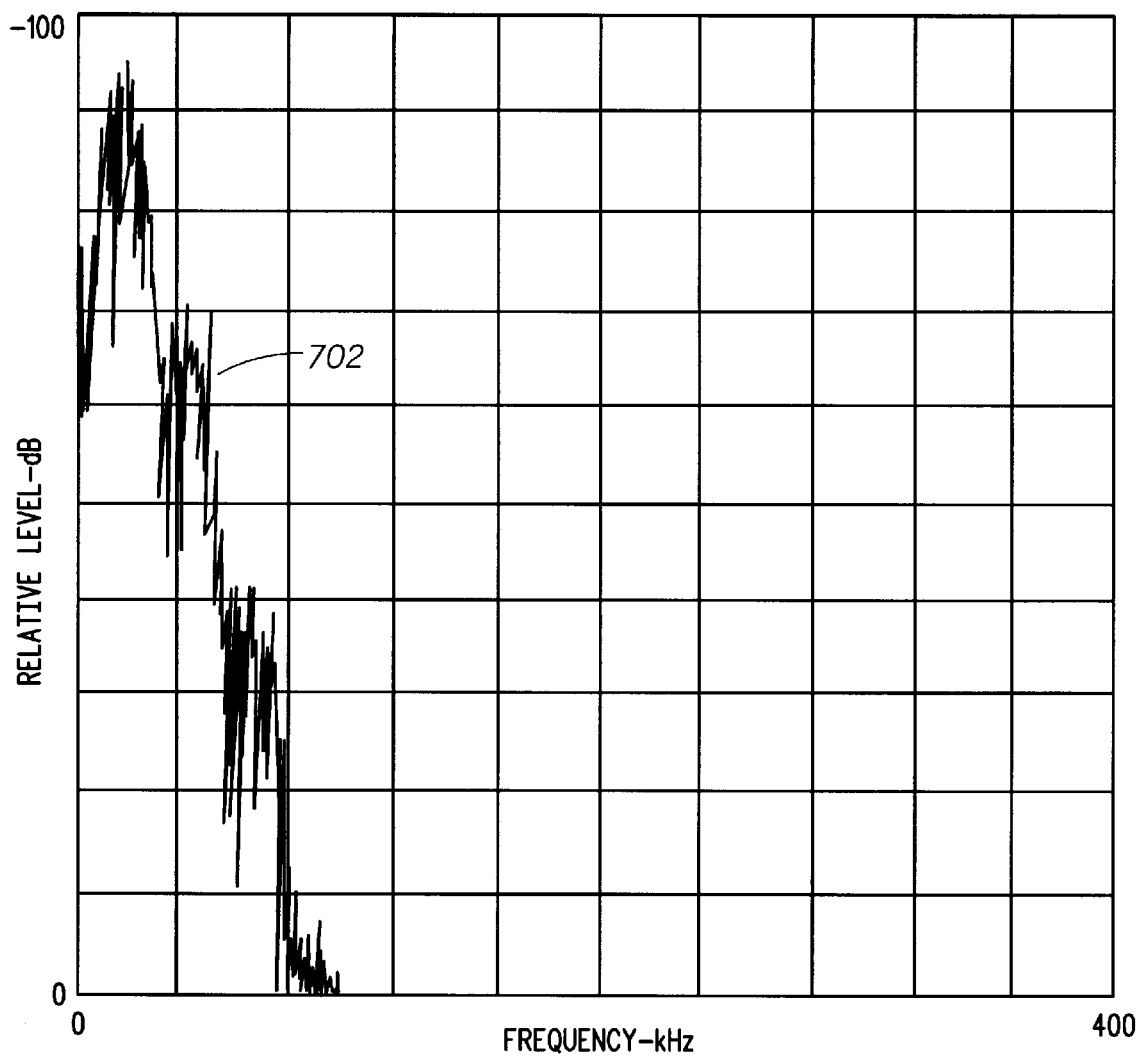
FIG. 7 is a graphical representation showing the spectrum of the polynomial mapped function for the 25 kHz QPSK signal.

The polynomial approximates the square root very closely. However, the small difference between the two signals results in a large difference in the bandwidth of the signals. This difference is shown clearly in the spectral representations of the ideal input envelope and the polynomial-mapped envelope (602) in FIG. 6, numeral 600 and FIG. 7, numeral 700, respectively. The signal used here is a 25 ksps QPSK signal used in a satellite subscriber phone application.

Here the error power has been minimized. Other functions may be minimized using the same algorithm. Obviously this would result in different polynomial coefficients. However, the algorithm taught here may be used without any changes. It is interesting to note that the linear term proportional to the envelope has been completely eliminated. This is a significant departure from all prior art that uses the linear term only for supply and bias modulation.

A practical application of this technique is illustrated for a base station power amplifier where improved power efficiency through the application of supply modulation is desired but another important requirement is the maintenance of very low levels of transmitter noise in adjacent channels that are at relatively wide offsets from the carrier frequency. The basic operational requirement in achieving low noise levels while employing supply modulation is avoidance of a wide spectrum in the supply modulation signal. The reason for this is the imperfect multiplier action provided by a typical real-world RF power amplifier when its supply is modulated—whether the amplifier is operated in an EER mode with a phase-modulated constant-envelope RF input or in an envelope-following class-AB mode with a full composite input having both amplitude and phase variations. This leads to a mapping of the input envelope signal as has been previously discussed in order to reverse the spectral expansion created by the envelope generation or detection process. The mapping may take place in a circuit, software or a look-up table.

A polynomial series function of powers of the envelope squared—or alternately, even-ordered powers of the envelope itself—will be used for the mapping. As has been previously shown, a fourth-order polynomial (envelope to the eighth power) can be made to closely fit the square root response of an ideal envelope detector. There are tradeoffs that can be made, however, in the number of terms in the series and how close the fit is in specific portions of the response. It will be assumed in this example that a linear response over a significant portion of the dynamic range of the input envelope is preferred because it provides an essentially constant level of gain compression in this region. If a high-order polynomial were employed, a very close fit could be achieved down to nearly zero input and output. If this were done, however, the baseband spectrum of the mapped envelope would be n/2 times wider than the spectrum of the envelope squared, where n is even and also the order of the polynomial. An excessively wide spectrum generated by the mapping would have negative implications for the required bandwidth and slew-rate of the modulator's power converter as well as the bandwidth of any type of linearization system that might be employed concurrently with modulator. A significant reduction in the required order of the polynomial consistent with adequate tracking of the linear response—along with a corresponding reduction in the mapped spectrum—can be achieved by recognizing where close tracking of the linear response can be relaxed.

The most critical portion of the envelope signal with respect to power efficiency is approximately the upper three quarters of the total envelope dynamic range from 0 volts to peak supply. At one quarter of the peak supply, for example, a maximum of only 6.25% of the peak power is supplied to the PA. Averaged over the statistics of typical modulating signals, power inefficiencies at these levels impose little impact on the overall PA efficiency. The polynomial can therefore deviate from the ideal linear mapping in the lower quarter of the dynamic range to facilitate the representation. In the proposed polynomial function, a linear or first-order term would represent a direct translation of the wide envelope spectrum to the mapped envelope and is therefore excluded. Coefficients of higher order terms are selected to cause the function to track a linear response above a threshold level (e.g., one quarter of the peak supply) for optimum efficiency and RF distortion, although a limited number of even-order terms is preferred for reasons already stated.

To continue the illustrative example, the envelope is mapped through a sixth-order polynomial of the form:

$$v_m(t)=1-k(1-a_1v_e^2(t)+a_2v_e^4(t)-a_3v_e^6(t)) \qquad (14)$$

where k represents the maximum negative excursion from the peak supply level of 1.0 and $a_2$ through $a_6$ are coefficients of the polynomial. The coefficients can be determined in a simplified quasi-empirical manner by setting three criteria for matching the classic linear response as follows:

1) $v_m(t)=1$ when $v_e(t)=1$ (15)

2) $dv_m(t)/dv_e(t)=1$ when $v_e(t)=1$, and (16)

3) $v_m(t)=x$ when $v_e(t)=x$ (17)

where x is an intermediate value within the dynamic range of $v_e(t)$ (0.0 to 1.0) that will provide an acceptable fit of the polynomial to the linear transfer function. These criteria result in the following three simultaneous equations which permit solution for the three coefficients:

$$a_2-a_4+a_6=1 \qquad (18)$$

$$a_2-2a_4+3a_6=\tfrac{1}{2}k \qquad (19)$$

$$a_2-a_4x^2+a_6x^4=(k+x-1)/kx^2 \qquad (20)$$

Figure 8:
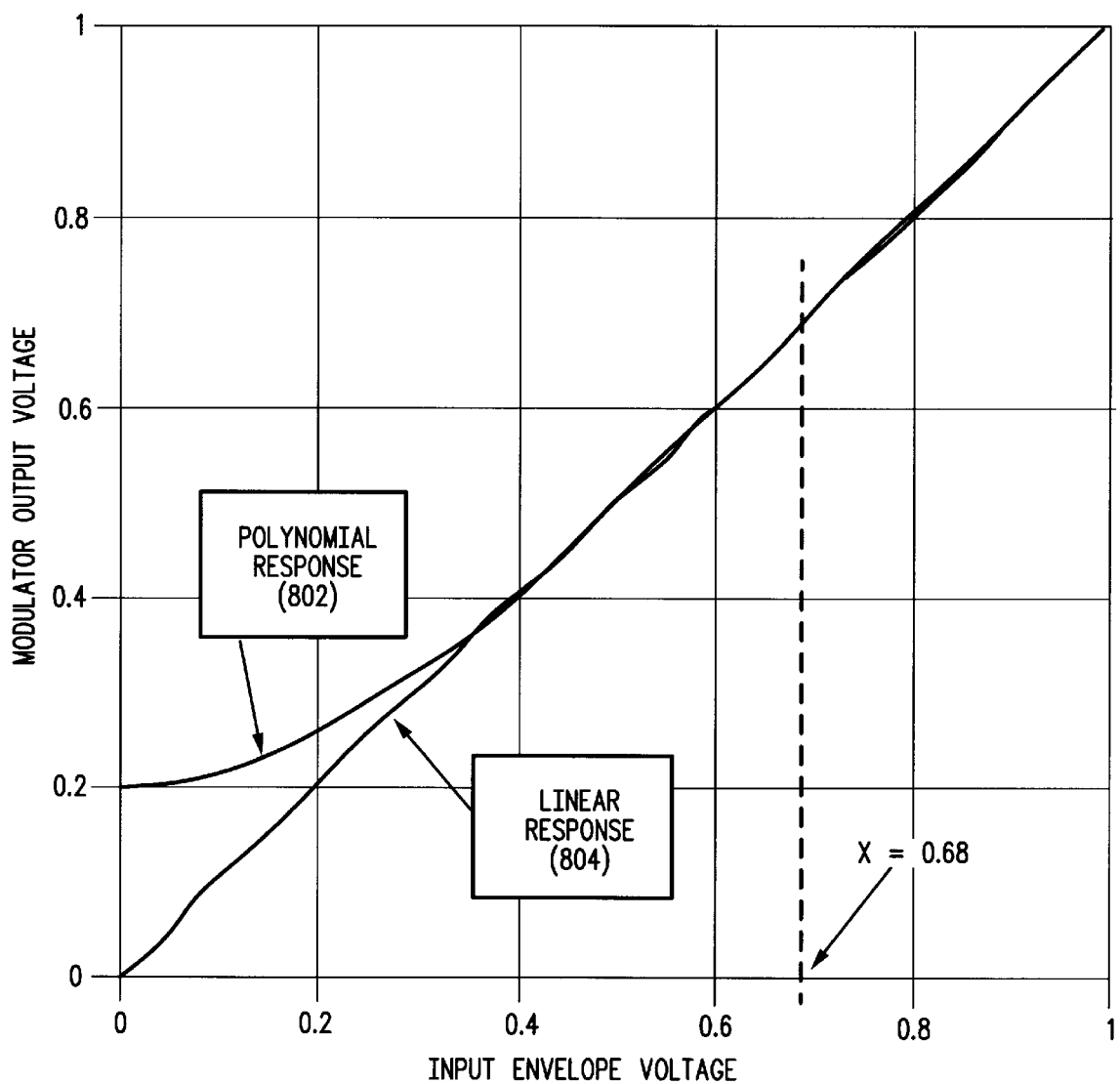
FIG. 8 shows a graphical representation of a plot of modulator output voltage vs. input envelope voltage utilizing polynomial shaping in accordance with the present invention.

An example is shown in FIG. 8, numeral 800, where $v_m(t)$ is plotted vs. $v_e(t)$ for k=0.8 and x=0.68. Above a normalized input envelope voltage of approximately 0.32 volts, the polynomial response (802) tracks the classic linear envelope modulator response (804) very closely, thereby providing the same efficiency performance and supply-induced RF distortion effects as the linear response in this region. Below 0.32 volts, the polynomial response (802) provides higher voltage to the power amplifier compared to the linear response (804). Although there is an efficiency degradation in this region, the additional power consumed is very small compared to the total power consumed by the power amplifier over the modulation's full dynamic range. As a result, the efficiency of a power amplifier modulated by the transformed envelope will degrade very little compared to modulation through the classic linear modulator response.

Although a sixth-order polynomial realization of the transfer function is described, it is clear that the approach is general. For example, a fourth-order response could be employed, although the it would have greater degradation in tracking accuracy than the sixth-order response and a consequent degradation in efficiency and RF distortion. Certain bounded transcendental functions characterized by even symmetry with respect to their argument—e.g., cosine, hyperbolic secant functions, certain elliptic and Bessel functions, and series' of powers of these functions—could also be employed. Even symmetry is a requirement because it corresponds to absence of a linear term. Ultimately, all of these approaches to the description of the mapping function could be expressed as an even-order polynomial series. Although not as desirable because of the additional spectrum introduced, odd-order terms could also be beneficially employed in the polynomial. Clearly, the first-order or linear term—which is commonly depicted in the prior art-is not used in the mapping function since it provides a direct translation of the wide envelope spectrum to the power amplifier modulation signal.

In a preferred embodiment, the polynomial form of the envelope modulation mapping function is characterized by:

1) the function lacks a linear or first-order term;

2) the function contains only even-order terms and an offset constant; and 3) the order of the function is minimal, but is selected to provide a predetermined level of efficiency and RF distortion.

Figure 9:
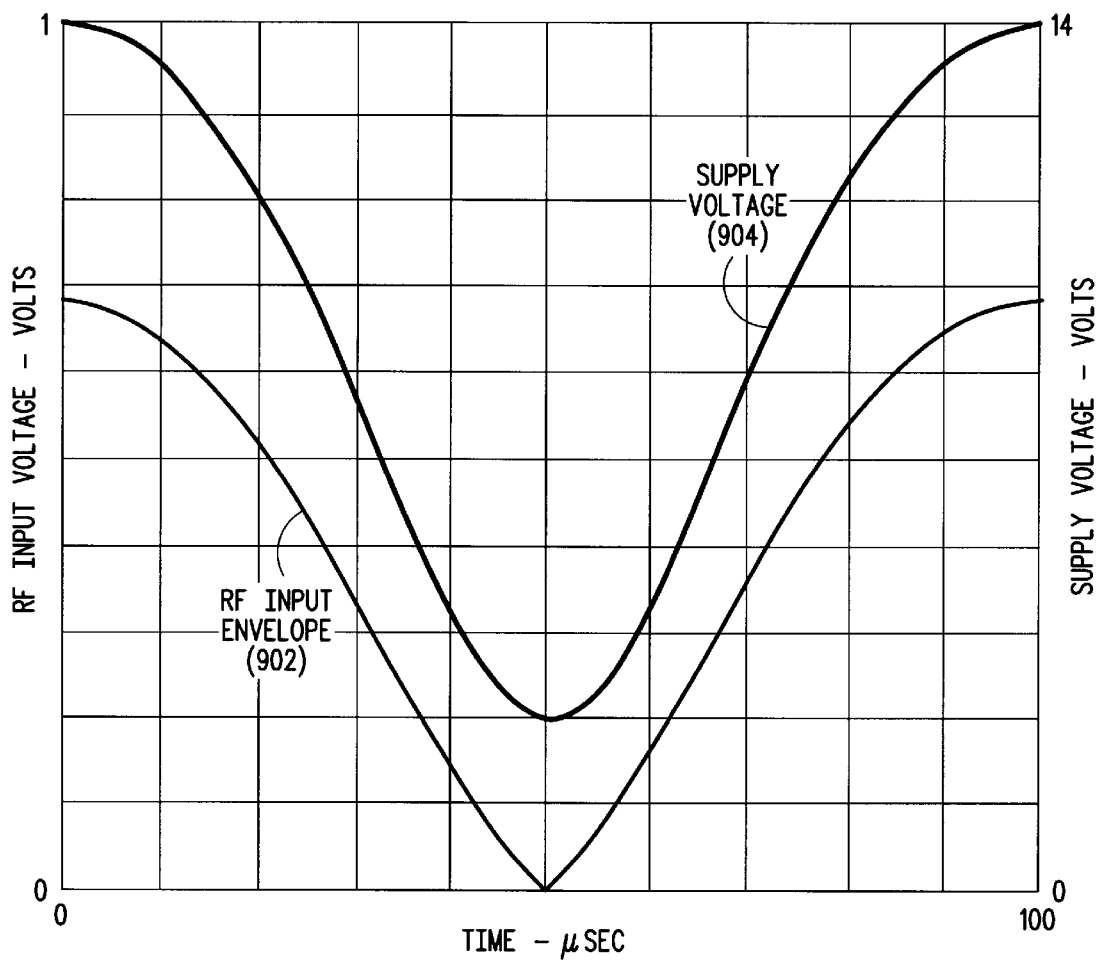
FIG. 9 shows a graphical representation of one embodiment of supply voltage and RF input voltage with respect to time where supply voltage is shaped by a polynomial function in accordance with the present invention.

FIG. 9, numeral 900, shows a graphical representation of one embodiment where the envelope of the RF input voltage (902) for a two-tone signal and the resulting supply voltage (904) with respect to time where supply voltage is mapped by a sixth-order polynomial function in accordance with the present invention.

Figure 10:
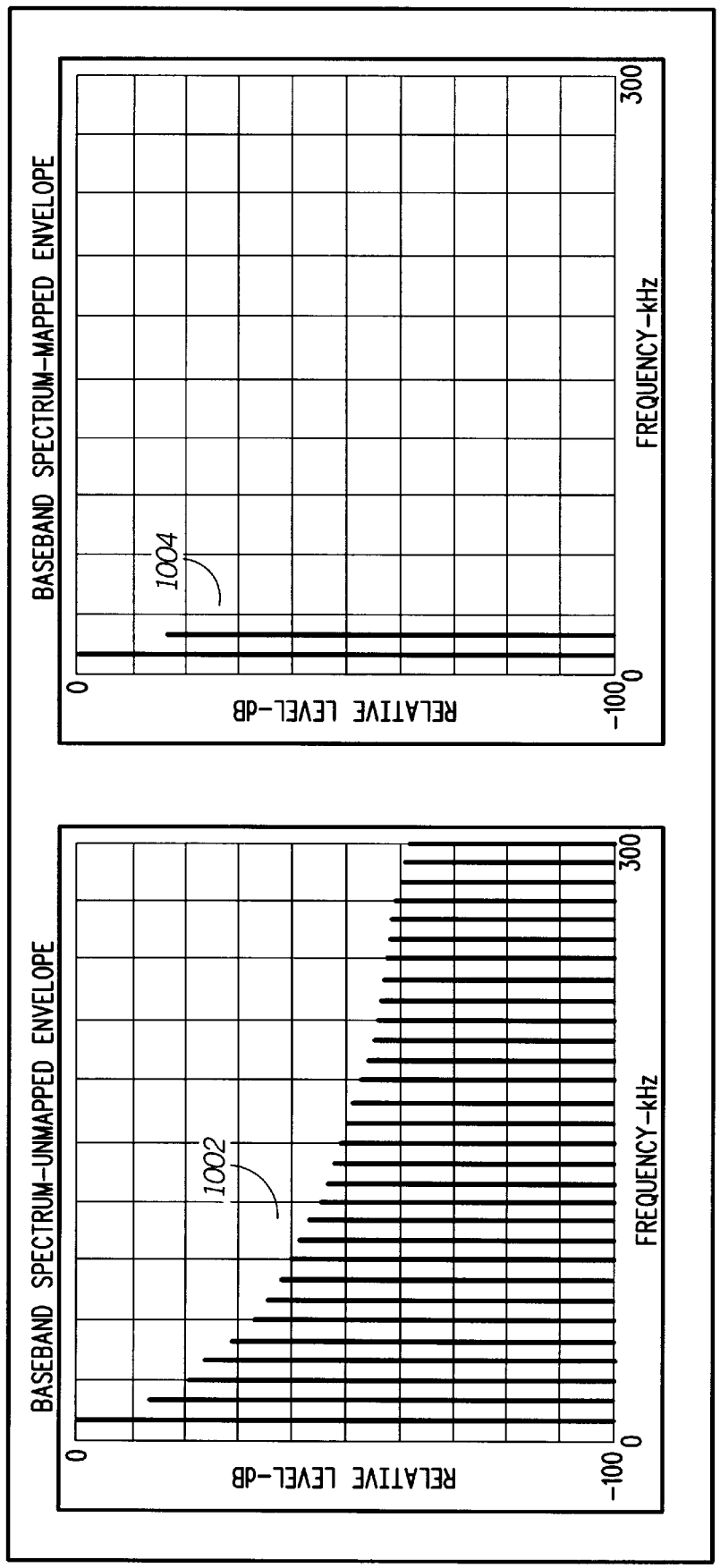
FIG. 10 shows a graphic representation of a comparison of the modulator output spectrum as known in the prior art and with polynomial mapping in accordance with the present invention.

FIG. 10, numeral 1000, shows the dramatic reduction in the frequency content of a conventional two-tone envelope (1002) as compared to the same envelope processed through polynomial-mapping (1004) in accordance with the present invention.

Figure 11:
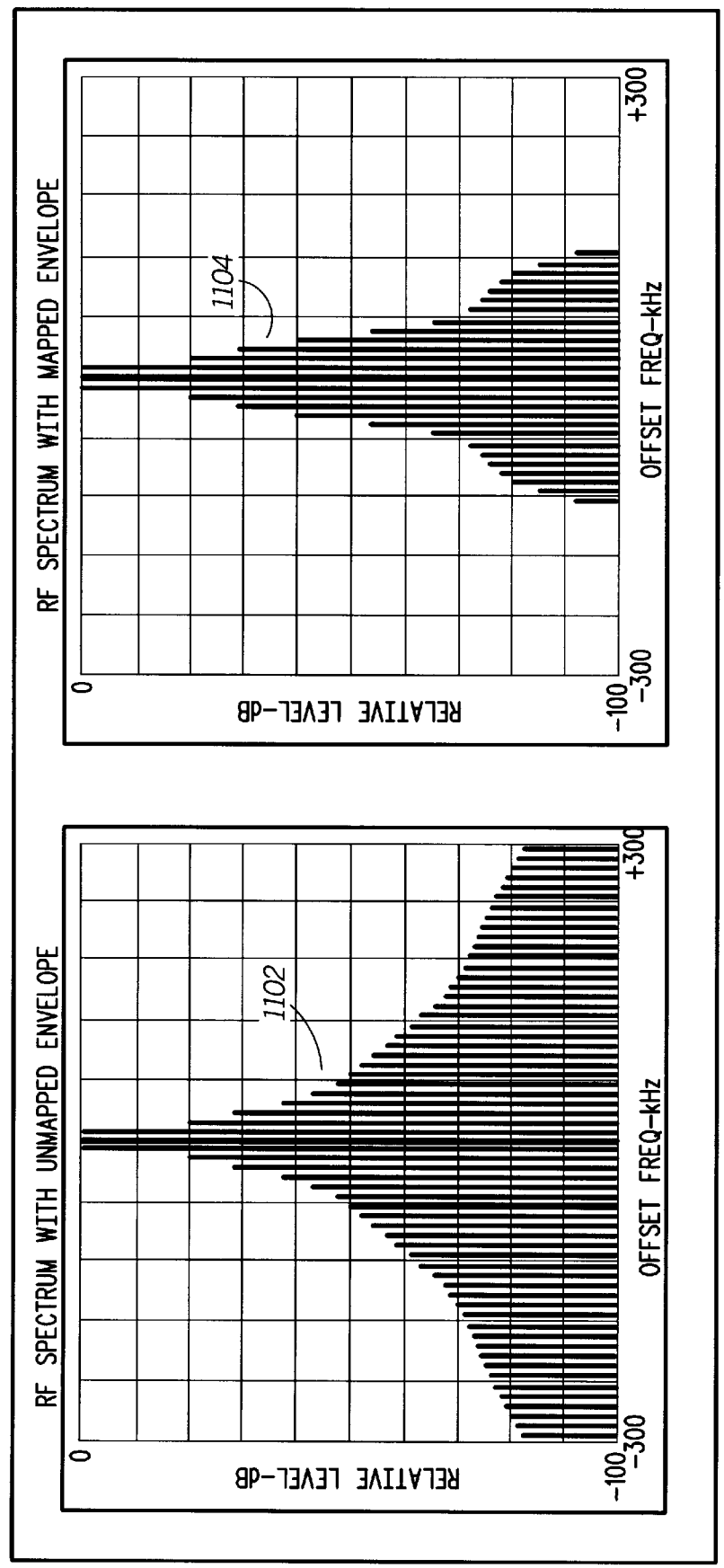
FIG. 11 shows a graphic representation of a comparison of the RF power amplifier output spectrum as known in the prior art and with polynomial mapping in accordance with the present invention.

FIG. 11, numeral 1100, shows the corresponding spectra at the RF carrier frequency for a computer simulation made using a Motorola MRF839 RF power device model operating in a class-AB envelope-following mode. Application of a conventional two-tone envelope to the supply terminal of circuit results in a very wide spectrum at the carrier frequency (1102). The collector efficiency for this case was 69.2%. There is a very pronounced reduction in wide-offset products beyond ±30 kHz (1104) when the same envelope signal is processed through polynomial-mapping in accordance with the present invention. The collector efficiency in this case decreases slightly to 67.5%. This example illustrates that modulation mapping provides supply modulation with a favorable off-channel spectrum while imposing minimal degradation in efficiency. While the mapping results in significant improvements in wide-offset spectrum, the closer-in products are essentially unaffected. However, conventional linearization techniques such as feedback or pre-distortion can be implemented to reduce these products as well. Envelope mapping provides an additional benefit in this scenario as well by reducing the bandwidth of the PA distortion products and thereby reducing the bandwidth requirements of the linearization system. Yet another benefit of modulation mapping including a departure from tracking at low inputs is a reduction not only in the modulator bandwidth but also in slew-rate requirements.

The example above which illustrates the viability of departure from tracking of the envelope response down to zero volts has benefits beyond reduction of wide-offset emissions and reduction of modulator bandwidth and slew-rate requirements. Certain classes of power converters are limited in the range of output voltages that they can produce. For example, a boost converter can produce voltages greater than the DC input voltage. Therefore, the envelope to supply mapping used with this type of converter must have a lower limit equal to the input voltage. If a hard lower limit is imposed on the mapped outputs, abrupt transitions are created in the envelope to supply mapping output. This results in high frequency components that are undesirable.

This problem may be resolved by using polynomial mapping as follows. An idealized linear mapping of envelope to supply is chosen. The lower bound is then introduced into this mapping function. This results in a piecewise linear function. A least-squares estimator can be used to approximate the piecewise linear function by an even-order polynomial of the baseband envelope. Thus we obtain a polynomial of $(I^2+Q^2)$.

This method allows the use of boost converters for envelope-following applications. There has been a migration of cellular phones and other portable communication systems to lower voltage batteries. In the future further lowering of this voltage is anticipated as a single cell battery system is approached. In this context, the ability to use a simple boost converter for envelope-following is of considerable advantage. The RF power amplifier could then be operated at higher supply voltage than the battery. This would allow the use of higher voltage RF power amplifiers that have lower cost and higher efficiency and which are readily available at this time.

The linearity of a linear RF power amplifier may be characterized by its gain and phase variation in response to amplitude variations. Thus, if an amplifier has little gain and phase variation in response to the entire range of amplitudes applied, it has high linearity. This results in a spectrum that produces minimal coupled power (or splatter) into the adjacent channels. In most radio systems, there are strict limits on the amount of splatter interfering with the adjacent channel, resulting in strict limits on the gain and phase variations allowed in a RF power amplifier.

For any RF power amplifier, linearity is a critical issue. Once the modulation format is chosen, the way to improve linearity is by improving the RF power amplifier. Alternate methods to improve linearity include predistortion and feedback linearization. Unfortunately, all these methods increase power consumption and lower efficiency. In the context of an envelope-following system, the choice of the envelope-to-supply mapping can affect the amount of gain and phase variation. For example, the phase variation for typical RF power amplifiers increases dramatically if the supply voltage approaches zero. Unfortunately, this is the case in many modulation schemes which utilize the envelope of the RF signal to generate a proportional supply modulation signal . . . . If the supply is simply proportional to the envelope as is typical of prior art, large phase variations through the RF power amplifier will result. The consequences include increased nonlinearity and adjacent-channel splatter. To avoid this scenario, zero avoidance techniques have been developed that prevent the RF envelope from approaching zero. This solves the linearity problem at the cost of significant increase in system complexity.

The improved envelope-to-supply mapping as described above for a boost converter can accomplish zero avoidance without changing the envelope of the RF signal. Here, the envelope of the RF signal is allowed to go to zero, but the supply is prevented from following it. This is effectively a zero avoidance strategy for envelope-following systems. As was shown in the base station example, there is negligible difference in power consumption by the RF power amplifier associated with the zero avoidance. Thus, the linearity improvement obtained is not at the cost of power consumption.

It is also possible to limit gain variations by using other appropriate envelope to supply mappings. The gain of the RF power amplifier is a function of the input RF signal envelope and the supply voltage. Consider a Cartesian coordinate system with the signal envelope and the supply voltage as the axes. In this plane a locus of points is plotted for constant gain. This plot can be interpreted as a piecewise linear function for the supply to envelope mapping. Again, this piecewise linear function may be approximated as a polynomial of the envelope squared.

Figure 12:
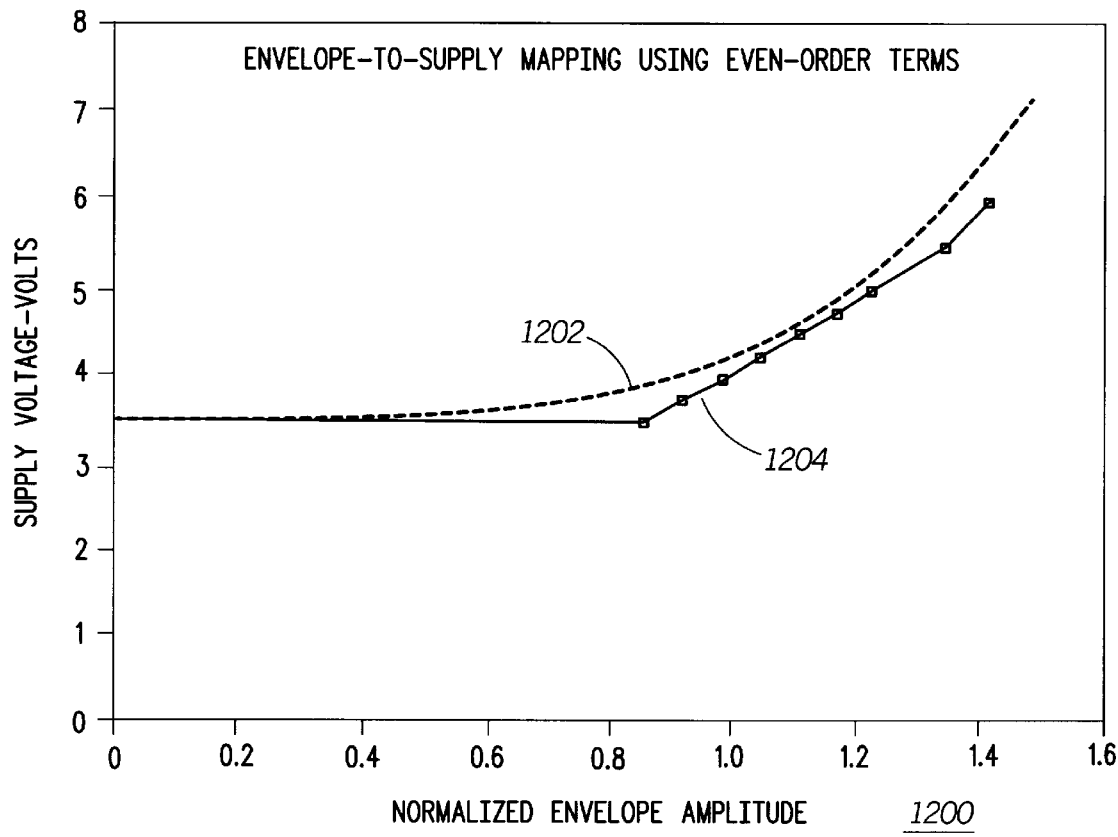
FIG. 12 shows a graphical representation of the envelope to supply mapping incorporating a voltage limit for a boost converter and constant gain for the RF power amplifier MHW920.

In FIG. 12, numeral 1200, the envelope-to-supply mapping (1202) incorporating both a voltage limit to facilitate a boost converter and constant gain for the RF power amplifier MHW920 is shown graphically. The mapping is obtained as a curve-fit to constant gain data points (1204). This is an RF power amplifier designed to operate at a nominal supply of 6 V. A boost converter using the envelope-to-supply mapping shown may be used to operate this power amplifier from a 3.6 V battery. This would result in significant power savings while allowing the migration to a lower voltage battery. Here, a low-order polynomial has been chosen for the mapping further limiting the supply bandwidth requirements.

The preferred embodiment of the polynomial mapping function is in digital hardware. In this context, the mapping function is easily changed by changing the polynomial coefficients. For a given RF power amplifier and modulation scheme there exists a specific polynomial that would result in the most linear operation. It would be advantageous to operate the radio with the polynomial coefficients for this specific polynomial.

The coefficients are programmable and can be tuned manually at the factory as part of a procedure called phasing of the radio. This is a common practice for tuning certain critical features in a radio. Also, the polynomial coefficients can be programmed in the field to compensate for changes in the RF power amplifier characteristics with temperature. This could be extended to tuning the polynomials for the best linearity.

If there is significant variation in the radio due to aging, temperature, load mismatch and other parameter variations, it may be necessary to adjust the polynomial coefficients dynamically. A gradient algorithm is suggested here for this tuning process.

One advantage of dynamic tuning is minimization of power consumption. The current practice is to design RF power amplifiers with linearity well above specification at nominal conditions such that linearity specification is met in the worst case situation. This results in higher power consumption at nominal conditions. Any dynamic tuning of the supply voltage would allow optimization of both linearity and power consumption over the entire range of operating conditions.

In the prior art, the system may introduce a feedback linearization method to linearize a RF power amplifier to meet stringent splatter requirements. In these radios it would be advantageous to employ supply modulation to improve efficiency. However, the bandwidth of the linearization scheme is limited. Any disturbance introduced above the bandwidth of the linearization loop cannot be corrected. The use of the polynomial mapping function strictly limits the bandwidth of the supply voltage. The order of the polynomial is chosen such that the supply bandwidth is less than the loop bandwidth of the linearization scheme.

Predistortion is another method for linearization of RF power amplifiers. Predistortion may be combined with envelope-following for systems requiring high efficiency and high linearity. The ability of predistortion to correct for wide-band distortion is limited. This limitation arises due to sampling associated with the digital implementation of the predistortion process. Sampling fundamentally limits any response above the Nyquist rate, which is half the sampling frequency. Thus, any spectral content in the supply above half the sampling rate of the predistortion scheme would not be corrected. Again an appropriate choice of the order of the polynomial mapping function limits the bandwidth of the supply voltage and maintains the linearization obtained from the predistortion scheme.

The mapping relation between the envelope and the supply voltage is determined by efficiency and linearity criteria. Two kinds of nonlinearities in RF power amplifiers are described as amplitude-to-amplitude distortion (AM-to-AM) and amplitude-to-phase distortion (AM-to-PM). The latter is increased when the PA supply is allowed to approach zero volts. This often defines the allowable lower limit of the supply variation.

AM to AM distortion can be reduced by introducing an appropriate amount of envelope signal in a manner consistent with improving efficiency. The power amplifier is operated at a constant saturation in the upper range of envelope amplitudes. This determines a portion of the mapping between the envelope and the supply voltage which is approximately linear. For lower envelope amplitude levels, the supply voltage is held constant. The combination of the two mappings create a piece-wise linear relationship between the envelope and supply voltage. This may be approximated such that the supply voltage is a polynomial function of the envelope similar to the base station modulator and boost converter implementations.

Other implementations of envelope-following are possible, employing envelope detection of the RF input as opposed to using a baseband input. However, the approach described above allows the precise measurement of the envelope from the input data. This results in a system whose linearity is not compromised by imperfect detection of the envelope signal. Further, it also allows compensation for the time delay in the switcher.

Envelope-following is expected to affect the linearity of the RF power amplifier. The data in the following tables, which is well within acceptable limits, was taken to illustrate that there is little degradation in signal quality. TABLE 1, shown below, lists the adjacent- and alternate-channel power levels with and without supply modulation. Note that this data was taken with a switching converter providing the supply modulation. The supply modulation was derived from the detected RF input signal, and this introduced a time delay of 2–4 $\mu$s between the supply and the envelope. This much delay in an EER (envelope elimination and restoration) system would be quite unacceptable. This illustrates the robustness of the envelope-following approach:

TABLE 1

ADJACENT-CHANNEL COUPLED POWER DATA

| | Envelope-Following | | Fixed Supply | | Condition |
|---|---|---|---|---|---|
| | Upper | Lower | Upper | Lower | |
| adjacent-channel power | −31.6 dB | −32.5 dB | −34.7 dB | −33.5 dB | Modulation Only |
| alternate-channel power | −47.5 dB | −49.1 dB | −50.5 dB | −50.9 dB | |
| adjacent-channel power | −31.6 dB | −32.5 dB | −34.7 dB | −33.5 dB | Modulation & Transient |
| alternate-channel power | −47.5 dB | −48.4 dB | −50.0 dB | −50.0 dB | |
| adjacent-channel power | −27.4 dB | −27.4 dB | −31.6 dB | −31.3 dB | Worst-Case Load Mismatch |
| alternate-channel power | −48.6 dB | −43.8 dB | −47.7 dB | −48.2 dB | |

There was also some concern that envelope-following would affect the demodulated signal. The experimental data in TABLE 2 (shown below) indicates that there is little signal degradation. It was possible to use a very aggressive envelope that maximized the power savings, and the in band signal degradation was still insignificant. However, this degraded adjacent-channel splatter which may be unacceptable in certain radio systems.

TABLE 2

ERROR VECTOR MAGNITUDE DATA FOR 25 ksps OFFSET QPSK SYSTEM

| | Envelope Following | | | Fixed Supply | | |
|---|---|---|---|---|---|---|
| Condition | EVM (rms) | Mag error | Phase err. | EVM (rms) | Mag error | Phase err. |
| Steady State | 4.0% | 3.0% | 1.3 deg. | 2.3% | 1.9% | 1.0 deg. |
| First 10 symbols of burst | 4.8% | 3.5% | 1.8 deg. | 4.0% | 3.1% | 1.4 deg. |
| Aggressive Envelope-Following | 4.3% | 3.0% | 1.5 deg. | | | |

Figure 13:
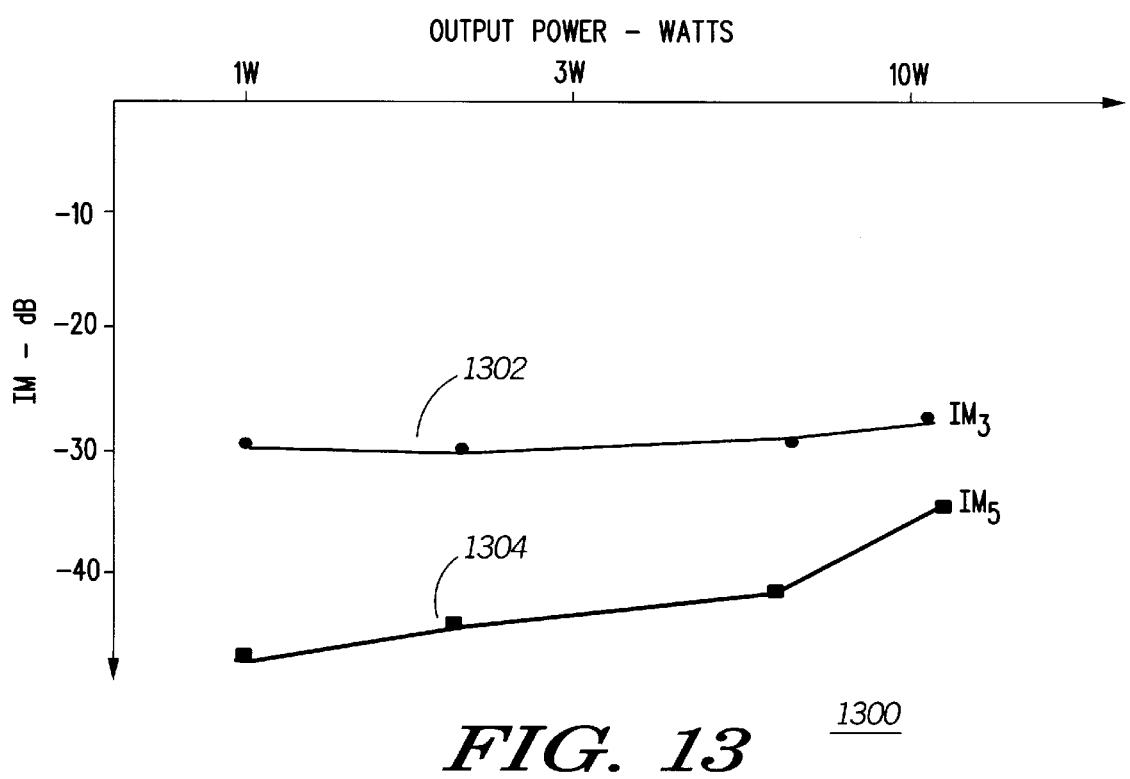
FIG. 13 shows a graphical representation of the IM (intermodulation) performance of the MHW913 for a 10 kHz two-tone signal with envelope-following in accordance with the present invention.
Figure 14:
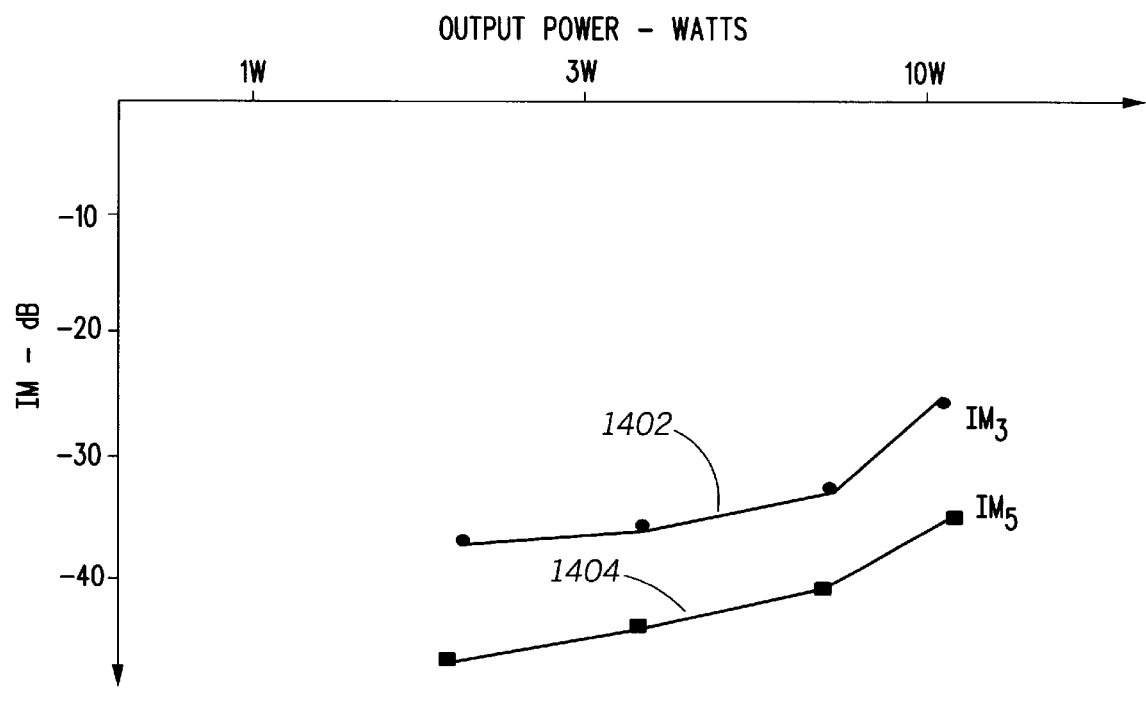
FIG. 14 shows a graphical representation of the IM (intermodulation) performance of the MHW913 for a 10 kHz two-tone signal with envelope-following with a fixed supply.

Another envelope-following circuit was built using the Motorola MHW913 LDMOS RF module that was capable of handling higher power (~10 W RF average output power compared to ~1 W for the MHW920 bipolar RF module). FIG. 13, numeral 1300, shows a graphical representation of the third (1302) and fifth-order (1304) IM (intermodulation) performance of the MHW913 for a 10 kHz-spaced two-tone signal using envelope-following in accordance with the present invention. This data compares favorably with FIG. 14, numeral 1400, which shows a graphical representation of the IM performance of the third (1402) and fifth-order(1404) IM of the MHW913 with a fixed supply. Note that envelope-following resulted in worse IM at lower power levels, but the IM was not significantly affected at the highest power level. Thus, the worst-case IM is not affected, and for a given IM specification the envelope-following system performs just as well as the system without supply modulation. These results indicate that the envelope-following scheme is applicable over a range of output powers and for different semiconductor technologies used in RF power amplifiers.

In one embodiment, the device of the present invention may be utilized in a multi-mode radio-telephone having a system for providing an efficient linear power amplifier that generates a variable-envelope RF signal among other possible signals. The system includes: A) an efficient envelope-following unit, coupled to receive a baseband signal, for outputting a supply voltage in accordance with either the variable envelope of the baseband signal or a constant envelope; B) an RF signal generator, coupled to receive the baseband signal and an RF carrier signal, for providing an RF input signal with amplitude and phase information to a linear RF power amplifier; and C) the linear RF power amplifier, coupled to the efficient envelope-following unit and to the RF signal generator, for outputting either: a power-efficient amplified variable-envelope RF signal with substantially the same amplitude and phase information as the RF input signal based on the variable envelope of the baseband signal or a power-efficient amplified constant-envelope RF signal with substantially the same phase information as the constant-envelope RF input signal. Clearly, this embodiment of the invention provides a flexibility for utilizing the multi-mode radio telephone in any one of a plurality of modes, depending on the choice of the user. The choice may be based on availability of a particular mode, or alternatively, on a provider rate differential in selection of modes.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

We claim:

1. A device for providing an efficient linear power amplifier that generates a variable-envelope radio frequency RF signal, comprising:
   A) an efficient envelope-following unit, coupled to receive a baseband signal, for outputting a supply voltage in accordance with a variable envelope of the baseband signal, wherein the efficient envelope-following unit includes:
      1) a bandwidth-limiting mapping unit, coupled to receive the baseband signal, for determining a reference signal; and
      2) an envelope-tracking power converter, coupled to receive the reference signal and to a power source, for outputting a supply voltage to the linear RF power amplifier responsive to the reference signal;
   B) an RF signal generator, coupled to receive the baseband signal and an RF carrier signal, for providing an RF input signal with amplitude and phase information to a linear RF power amplifier; and
   C) the linear RF power amplifier, coupled to the efficient envelope-following unit and to the RF signal generator, for outputting a power efficient amplified variable-envelope RF signal with substantially a same amplitude and phase information as the RF input signal.

2. The device of claim 1 wherein the bandwidth-limiting mapping unit utilizes a polynomial mapping function of the baseband signal to provide an implicitly bandlimited signal.

3. The device of claim 2 wherein coefficients of the polynomial mapping function are programmable.

4. The device of claim 2 wherein coefficients of the polynomial mapping function are selected to maintain a substantially constant gain for the linear RF power amplifier.

5. The device of claim 2 wherein coefficients of the polynomial mapping function are selected to minimize the phase shift through the linear RF power amplifier.

6. The device of claim 2 wherein coefficients of the polynomial mapping function are selected to limit a minimum value of the supply voltage for the linear RF power amplifier.

7. The device of claim 2 wherein coefficients of the polynomial mapping function are selected to maximize efficiency of the linear RF power amplifier.

8. The device of claim 1 wherein the bandwidth-limiting mapping unit uses a polynomial mapping function of a square of the variable envelope of the baseband signal to provide an implicitly bandlimited signal.

9. The device of claim 1 wherein the bandwidth-limiting mapping unit utilizes a transcendental function of the variable envelope of the baseband signal to provide a bandlimited signal, wherein the transcendental function is bounded and is characterized by even symmetry.

10. The device of claim 1 wherein the linear RF power amplifier is a class AB amplifier.

11. The device of claim 1 wherein the linear RF power amplifier is a class B amplifier.

12. The device of claim 1 further including an envelope detector coupled to the linear RF power amplifier output for providing a feedback signal to the envelope tracking power converter.

13. The device of claim 1 further including:
   A) a demodulator, coupled to the RF output and to the RF carrier signal, for demodulating the amplified variable envelope RF signal;
   B) a feedback linearizer, coupled to the demodulator and to the baseband signal, for linearizing the RF power amplifier.

14. A method for providing an efficient linear power amplifier that generates a variable envelope radio frequency RF signal, comprising the steps of:
   A) using an efficient envelope-following unit to output a supply voltage in accordance with a variable envelope of an input baseband signal, wherein using the efficient envelope-following unit includes:
      1) using a bandwidth-limiting mapping unit to determine a reference signal based on the baseband signal; and
      2) using an envelope tracking power converter to output a supply voltage, responsive to the reference signal, to the linear RF power amplifier;
   B) providing a RF input signal with amplitude and phase information to a linear RF power amplifier; and C) using the linear RF power amplifier to output a power efficient amplified variable envelope RF signal with substantially a same amplitude and phase information as the RF input signal.

15. The method of claim 14 wherein the linear RF power amplifier is a class AB amplifier.

16. The method of claim 14 wherein the linear RF power amplifier is a class B amplifier.

17. The method of claim 14 wherein using a linear RF power amplifier further includes providing an envelope detector coupled to the linear RF power amplifier output to provide a feedback signal to the envelope tracking power converter.

18. The method of claim 14 wherein using the bandwidth-limiting mapping unit includes utilizing a polynomial mapping function of the baseband signal to provide an implicitly bandlimited signal.

19. The method of claim 14 wherein using the bandwidth-limiting mapping unit includes using a polynomial mapping function of a square of the variable envelope of the baseband signal to provide an implicitly bandlimited signal.

20. The method of claim 14 wherein using the bandwidth-limiting mapping unit includes utilizing a transcendental function of the variable envelope of the baseband signal to provide a bandlimited signal.

21. The method of claim 20 wherein the transcendental function is one of: a cosine function and a series consisting of powers of a cosine function.

22. The method of claim 20 wherein the transcendental function is approximated by an nth order polynomial, where n is an integer, and which lacks a linear/first order term.

23. The method of claim 20 wherein the nth order polynomial is limited to even-order terms and an offset constant.

* * * * *